United States Patent
Shtrichman

(10) Patent No.: US 7,047,139 B2
(45) Date of Patent: May 16, 2006

(54) SHARING INFORMATION BETWEEN INSTANCES OF A PROPOSITIONAL SATISFIABILITY (SAT) PROBLEM

(75) Inventor: Ofer Shtrichman, Tel Aviv (IL)

(73) Assignee: International Business Machines Corporation, Armonk, NY (US)

( * ) Notice: Subject to any disclaimer, the term of this patent is extended or adjusted under 35 U.S.C. 154(b) by 894 days.

(21) Appl. No.: 09/990,390

(22) Filed: Nov. 23, 2001

(65) Prior Publication Data

US 2002/0123867 A1 Sep. 5, 2002

Related U.S. Application Data

(60) Provisional application No. 60/257,384, filed on Dec. 22, 2000.

(51) Int. Cl.
*G06F 9/45* (2006.01)
(52) U.S. Cl. .............................. 702/22; 703/2; 703/13; 703/4; 716/2; 716/5
(58) Field of Classification Search .................... 703/2, 703/13, 22; 716/5, 2
See application file for complete search history.

(56) References Cited

U.S. PATENT DOCUMENTS

| | | | | |
|---|---|---|---|---|
| 6,247,164 B1 * | 6/2001 | Ashar et al. ................... | 716/5 |
| 6,408,262 B1 * | 6/2002 | Leerberg et al. ................ | 703/2 |
| 6,496,961 B1 * | 12/2002 | Gupta et al. .................... | 716/5 |
| 6,591,400 B1 * | 7/2003 | Yang .............................. | 716/2 |
| 6,654,715 B1 * | 11/2003 | Iwashita ....................... | 703/22 |
| 6,728,665 B1 * | 4/2004 | Gupta et al. ................... | 703/2 |

OTHER PUBLICATIONS

"GRASP—A New Search Algorithm for Satisfiability", Silva et al, ICADD 96', IEEE 1063-6757/96, 1996 IEEE.*
"Symbolic Model Checking using SAT procedures instead of BDD's", Biere et al, DAC 99', pp. 317-320, ACM 1999.*
"Boolean Satisfiability in Electronic Desing Automation", Marques-Silva et al, DAC 2000, pp. 675-680, ACM 2000.*
"Satisfiability-Based Layout Revisited: Detailed Roouting of Complex FPGA's Vai Search-Based Boolean SAT", Nam et al, FPGA 99', pp. 167-175, ACM 1999.*
Silva et al. "GRASP-A New Search Algorithm for Satisfiability".
Shtrichman, Sharing Information Between SAT Instances.
Silva et al. "Robust Search Algorithms for Test Pattern Generation".

(Continued)

*Primary Examiner*—Fred Ferris
(74) *Attorney, Agent, or Firm*—Browdy and Neimark, PLLC

(57) ABSTRACT

A technique is disclosed for sharing information between closely-related SAT instances (instances with a non-empty intersection between their sets of clauses), which enables a speed-up in the overall solution time. This technique is particularly effective in SAT-based bounded model checking (BMC), and in problems of planning and logistics.

27 Claims, 4 Drawing Sheets

OTHER PUBLICATIONS

Shtrichman "Turning SAT Checkers for Bounded Model Checking".

Kim et al. "Incremental Boolean Satisfiability and its application to Delay Fault Testing".

Silva et al, "GRASP:A Search Algorithm for Propositional Satisfiability", vol. 48, No. 5 May 1999.

Biere et al. "Symbolic Model Checking Without BDDs".

Hooker "Solving the Incremental Satisfiability Problem", Mar. 1991.

* cited by examiner

SHARING INFORMATION BETWEEN INSTANCES OF A PROPOSITIONAL SATISFIABILITY (SAT) PROBLEM

CROSS-REFERENCE TO RELATED APPLICATION

This application claims the benefit of U.S. Provisional Patent Application No. 60/257,384, filed Dec. 22, 2000, which is incorporated herein by reference.

FIELD OF THE INVENTION

The present invention relates generally to methods for solving propositional satisfiability problems, with specific applicability, inter alia, to bounded model checking.

BACKGROUND OF THE INVENTION

Various methods are known in the art for automatically solving propositional satisfiability (SAT) problems. Most modern SAT-checkers are variations on the well-known Davis-Putnam procedure, which performs a backtracking search through a decision tree. At each node in the tree, the procedure chooses and tests an assignment, i.e., it selects a variable and assigns a Boolean value to the variable. The well-known unit clause rule is then used iteratively to deduce the assignments of additional variables, based on the assignment under test, in a procedure known as Boolean Constraint Propagation (BCP). If a given assignment is tested and is found to lead to a contradiction, the tree is pruned, using logical rules to remove paths that will not yield fruitful results.

For efficient BCP processing, it is useful to frame the SAT problem in conjunctive normal form (CNF). A CNF formula $\phi$ on n binary variables $x_1, \ldots, x_n$ is a conjunction (AND) of m "clauses" $\omega_1, \ldots, \omega_m$ each of which is a disjunction (OR) of one or more "literals." A literal is an occurrence of one of the variables or its complement (NOT). It is known in the art that any Boolean expression can be cast in CNF, and there are automatic tools available for transforming arbitrary Boolean expressions to CNF. The SAT problem is solved when an assignment to the variables $x_1, \ldots, x_n$ is found that makes all the clauses true, or when it is proved that there is no such assignment.

"GRASP" (Generic seaRch Algorithm for the Satisfiability Problem) is an efficient tool for solving SAT problems, using the CNF representation. GRASP is described by Marques-Silva and Sakallah in "GRASP: A Search Algorithm for Propositional Satisfiability," *IEEE Transactions on Computers* 48:5 (May, 1999), pages 506–516, which is incorporated herein by reference. A simplified pseudocode listing, giving a general framework for solving SAT problems, which is used in most modern SAT solvers (including GRASP) is presented below in Table I:

TABLE I

BACKTRACK SEARCH ALGORITHM

```
//   Input arg: Current decision level d
//   Return value:
//        SAT( ) :        {SATISFIABLE, UNSATISFIABLE}
//        Decide( ):      {DECISION, ALL-DECIDED}
//        Deduce( ) :     {OK, CONFLICT}
//        Diagnose( ):    {SWAP, BACK-TRACK}
SAT (d)
   {
11:     if (Decide (d) == ALL-DECIDED) return SATISFIABLE;
12:     while (TRUE) {
13:         if (Deduce(d) != CONFLICT) {
14:             if (SAT (d+1) == SATISFIABLE) return
                    SATISFIABLE;
15 :            else if (β < d || d == 0) // β is
                    calculated in Diagnose ( )
16:                 { Erase (d); return UNSATISFIABLE; }
            }
17:         if (Diagnose (d) == BACK-TRACK) return
                UNSATISFIABLE;
        }
   }
```

At each decision level d in the search tree, a variable assignment $V_d=\{T,F\}$ is selected using the Decide( ) function. If all of the variables are already decided (as indicated by ALL-DECIDED), it implies that a satisfying assignment has been found, and SAT returns SATISFIABLE. This outcome indicates, in the case of BMC, that a counterexample exists. Otherwise, Deduce( ) is used to find the implied assignments and to determine whether a conflict exists, i.e., whether given the actual assignments that have been made so far, it is possible to assign the remaining variables in such a way that the SAT formula will be true. A conflict typically arises if a given unassigned variable must be simultaneously TRUE to satisfy one of the clauses and FALSE to satisfy another. If there is no conflict, the SAT procedure is called recursively at the next decision level. Otherwise, Diagnose( ) is called to analyze the conflict and decide on the next step.

Diagnose( ) identifies the assignments that led to the conflict and determines whether $V_d$ is one of them. If so, the value of $V_d$ is swapped, and Deduce( ) is repeated. If the swapped assignment also fails, it means that $V_d$ is not responsible for the conflict. In this case, Diagnose( ) indicates that the procedure should BACK-TRACK to a lower decision level β. The procedure will then backtrack d-β levels, each time using Erase( ) to remove the current decision and its implied assignments before continuing the search. Marques-Silva and Sakallah present a method for computing β in the above-mentioned article.

The analysis of conflicts found by the above method allows "conflict clauses" to be computed and added to the CNF formula (also referred to as the "clause database") as constraints on the search. A conflict clause represents an auxiliary sub-formula, such that any assignment that fails to satisfy the sub-formula will invariably lead to a conflict in the original formula. For example, suppose that during BCP it is found that the assignment of variables x=T, y=F and z=F inevitably leads to a conflict, i.e., the conjunction of these assignments represents a sufficient condition for the conflict to arise. Consequently, the negation of this conjunction must be satisfied if the instance is satisfiable. We can therefore add the new conflict clause, $\pi=(\neg x \vee y \vee z)$, to the clause database, with the hope that it will speed up the search. The conjunction of π with φ will cause the search procedure to backtrack immediately if the conflicting assignment is repeated. Adding conflict clauses thus constrains the search space for subsequent iterations, making the SAT problem easier to solve and reducing computation time.

Incremental Satisfiability and Pervasive Conflict Clauses

In many types of SAT problems, multiple, related SAT instances must be solved. In such cases, it is useful to reuse information (the conflict clauses) found in one instance in order to solve the next instance more efficiently. Hooker first suggested a method for incremental solution of SAT problems in "Solving the Incremental Satisfiability Problem," *Journal of Logic Programming* 15 (1993), pages 359–363, which is incorporated herein by reference. He proposed an algorithm that accepts a satisfiable instance and an additional clause, and checks whether satisfiability is preserved when the new clause is added to the formula. His experiments showed that solving large instances incrementally can be faster than solving them as one monolithic formula.

This idea was extended by Kim et al. in "Incremental Boolean Satisfiability and its Application to Delay Fault Testing," *IEEE/ACM International Workshop on Logic Synthesis—IWLS'99* (June, 1999), which is also incorporated herein by reference. The authors used the technique for path delay fault testing, a process in which the effect of faults on delays in certain paths is checked. The large number of paths in such systems typically requires the partition of the problem into a series of instances, each representing a subset of the tested paths. All the paths share the same prefix P, which empirically is far larger than the suffixes $s_1 \ldots s_i$. Incremental satisfiability is then used in the following way: A satisfying assignment for P is sought, and conflict clauses are added to P (those clauses that are deducible directly from P). If P is unsatisfiable, the process halts because the conjunction of P with $S_i$ for all i is obviously unsatisfiable. Otherwise, the trace is used as an initial assignment when checking each of the instances $P \wedge S_i$ for all i. In case the initial trace does not lead to a satisfying assignment, the standard backtrack process is invoked.

A further extension to this idea was proposed for use in Automatic Test Pattern Generation (ATPG) by Marques-Silva and Sakallah, in "Robust Search Algorithms for Test Pattern Generation," *Proceedings of the IEEE Fault-Tolerant Computing Symposium* (June, 1997), which is incorporated herein by reference. The authors apply their GRASP SAT solving tool to generate test patterns, for use in finding faults in electronic circuit designs. Some of the conflict clauses that are computed during SAT solving of these instances are independent of the given target fault model and depend only on the function and structure of the circuit under test. These conflict clauses are declared "pervasive" conflict clauses, and they can be shared among different SAT instances that are used to generate test patterns for different target fault states in the same circuit. The authors note, however, that the question of how to identify pervasive conflict clauses outside the fixed framework of the circuit formula itself remains an open issue.

Bounded Model Checking

Biere et al. introduced the idea of applying methods of SAT solving to symbolic model checking in "Symbolic Model Checking without BDD," *Proceedings of the Workshop on Tools and Algorithms for the Construction and Analysis of Systems—TACAS*99 (Springer-Verlag Lecture Notes in Computer Science, 1999), which is incorporated herein by reference. Model checking is a method of formal verification that is gaining increasing popularity in verification of complex systems designs, such as integrated circuit chips.

To perform model checking of a design or a device, a verification engineer reads the definition and functional specifications of the device and then, based on this information, writes a set of properties {φ} (also known as a specification) that the design is expected to fulfill. The properties are written in temporal logic, which is a specification language suitable for expressing relationships between the variables of the design over time. Such languages are commonly based on Computation Tree Logic (CTL), as is known in the art. A hardware model M (also known as an implementation) of the design is created, which represents the device as a finite state machine. The model is then tested by an automated model checker to ascertain that the model satisfies all of the properties in the set under all possible input sequences, or alternatively, to find a counter-example, i.e., an input sequence and succession of state transitions in the model that lead to violation of one of the properties.

For real designs, the number of states in the system can be very large, and explicit traversal of the state space becomes computationally intractable. To address this problem, it is common to represent the states symbolically rather than explicitly, using characteristic functions and the special data structure of Binary Decision Diagrams (BDDs). Although this representation is useful in verifying many realistic systems, many designs cannot be verified due to the size of the associated BDDs.

In an attempt to overcome these problems, Biere et al. introduced the notion of bounded model checking (BMC) in the above-mentioned article. BMC considers only counter-examples up to a particular length k and generates a propositional formula that is satisfiable if (if and only if) such a counterexample exists. BMC is complementary to symbolic model checking with BDDs, since many designs that cannot be solved with BDD-based model checkers can be solved by BMC, and vice versa.

To prove that an invariant property p must be true in all states of the system that are reachable within k transitions, a BMC instance is defined as follows:

$$\varphi^k : I_0 \wedge \bigwedge_{i=0}^{k-1} \rho(i, i+1) \wedge \bigvee_{i=0}^{k} (\neg P_i) \qquad (1)$$

Here $I_0$ is the initial state, $\rho(i,i+1)$ is the transition between cycles i and i+1 of the system under verification, and $P_i$ is the property in cycle i. Equation (1) can be satisfied if there exists a reachable state in cycle i, $0 \leq i \leq k$, which contradicts the property $P_i$. In other words, satisfying equation (1) is equivalent to finding a counterexample to p. In CTL terms, p is a safety property, represented as AGp ("always global" p). Since the computational complexity of evaluating a formula is exponential in the number of variables involved, a common strategy in BMC is to begin with a low value of k, and then to continue incrementally to higher values until a counterexample is found, or a diameter D of the model is reached, or the problem becomes intractable. (The diameter D is a number such that all bugs can be found with $k \leq D$.)

Equation (1) has the form of a SAT problem. Thus, methods known in the art for automatically solving SAT problems can be applied, mutatis mutandis, to BMC.

SUMMARY OF THE INVENTION

Preferred embodiments of the present invention provide systematic methods for determining which conflict clauses can be shared among SAT instances, and for processing of groups of SAT instances using these shared conflict clauses. These methods are particularly useful in solving BMC problems, as described in detail hereinbelow. They are also applicable to SAT problems in other areas, such as electronic design automation, planning and logistics problems.

In preferred embodiments of the present invention, a set of two or more SAT instances is defined for processing by a SAT-checking system. The instances in the set are examined to determine which clauses they have in common. In a first instance in the set, when conflicts are found to occur, appropriate conflict clauses are identified, along with the clauses of the SAT formula that lead up to each of the conflict clauses. The system checks each of the conflict clauses found in the first instance in order to determine whether all of the clauses that led up to the conflict clause in the first instance are also included in the next instance to be addressed. If so, the conflict clause is reused as a constraint in the next instance. This procedure may be repeated successively over multiple instances in the set.

In some preferred embodiments of the present invention, the set of SAT instances form a sequence, with a predefined incremental addition and/or removal of clauses from each instance to the next. An example of such a sequence is a sequence of BMC instances, in which the number of transition cycles k is incremented from one instance to the next. In such cases, many of the conflict clauses that were created with lower k can be added to the next instance. This procedure continues iteratively up to the diameter of the design in question or to some other predetermined limit on k or on computation time.

There is therefore provided, in accordance with a preferred embodiment of the present invention, a method for satisfiability (SAT) testing, given a set of formulas describing a target system, the formulas including clauses that include variables and express constraints on states of the system, the set of the formulas including at least a first and a second formula, the method including:

analyzing the first formula while deducing one or more conflict clauses, each such conflict clause expressing assignments of the variables that prevent a respective conflict, subject to which the first formula cannot be satisfied, while determining, for each of the conflict clauses, the clauses in the first formula that lead to the respective conflict;

identifying the conflict clauses for which the clauses that lead to the respective conflict in the first formula are a subset of the clauses in the second formula; and analyzing the second formula subject to the identified conflict clauses, in order to determine whether the second formula can be satisfied.

Preferably, the clauses are formulated in a conjunctive normal form (CNF), and analyzing the second formula includes forming a conjunction of the CNF of the second formula with the identified conflict clauses, and solving the conjunction. Further preferably, analyzing the first formula includes determining while analyzing the first formula whether, for each of the conflict clauses, the clauses that lead to the respective conflict are in the subset of the clauses in the second formula.

There is also provided, in accordance with a preferred embodiment of the present invention, a method for bounded model checking (BMC) of a target system, including:

generating a succession of BMC instances describing the target system in the form of propositional satisfiability (SAT) formulas, the formulas including clauses that include variables and express constraints on states of the system;

analyzing a first instance in the succession of the BMC instances while deriving one or more conflict clauses that forbid certain assignments of the variables that give rise to conflicts, subject to which the first instance cannot be satisfied;

for each of the instances in the succession subsequent to the first instance, identifying the conflict clauses derived in a preceding one of the instances that are also pertinent to the subsequent instance; and solving the subsequent instance subject to the identified conflict clauses, so as to seek a satisfying assignment of the variables, such that when a satisfying assignment is not found at the subsequent instance, one or more further conflict clauses are derived for use in solving a further one of the instances in the sequence.

Preferably, identifying the conflict clauses includes finding the conflict clauses that are induced by the clauses in the preceding one of the instances that are also included in the subsequent instance. In a preferred embodiment, solving the subsequent instance includes solving the subsequent instance subject to substantially all of the conflict clauses identified as pertinent to the subsequent instance in a plurality of the instances in the sequence prior to the subsequent instance.

In a further preferred embodiment, generating the succession of BMC instances includes defining a model and a safety property of the target system, and wherein solving each of the instances includes finding a violation of the safety property corresponding to the satisfying assignment.

There is additionally provided, in accordance with a preferred embodiment of the present invention, apparatus for satisfiability (SAT) testing, including a satisfiability processor, which is arranged to receive a set of formulas describing a target system, the formulas including clauses that include variables and express constraints on states of the system, the set of the formulas including at least a first and a second formula, the processor being further arranged to analyze the first formula while deducing one or more conflict clauses, each such conflict clause expressing assignments of the variables that prevent a respective conflict, subject to which the first formula cannot be satisfied, while determining, for each of the conflict clauses, the clauses in the first formula that lead to the respective conflict, and to identify the conflict clauses for which the clauses that lead to the respective conflict in the first formula are a subset of the clauses in the second formula, the processor being still further arranged to analyze the second formula subject to the identified conflict clauses, in order to determine whether the second formula can be satisfied.

There is further provided, in accordance with a preferred embodiment of the present invention, apparatus for bounded model checking (BMC) of a target system, including a verification processor, which is arranged to receive a succession of BMC instances describing the target system in the form of propositional satisfiability (SAT) formulas, the formulas including clauses that include variables and express constraints on states of the system, the processor being further arranged to analyze a first instance in the succession of the BMC instances while deriving one or more conflict clauses that forbid certain assignments of the variables that give rise to conflicts, subject to which the first instance cannot be satisfied, and to identify, for each of the instances in the succession subsequent to the first instance, the conflict clauses derived in a preceding one of the instances that are also pertinent to the subsequent instance, the processor being still further arranged to solve the subsequent instance subject to the identified conflict clauses, so as to seek a satisfying assignment of the variables, such that when a satisfying assignment is not found at the subsequent instance, the processor derives one or more further conflict clauses for use in solving a further one of the instances in the sequence.

There is moreover provided, in accordance with a preferred embodiment of the present invention, a computer software product for satisfiability (SAT) testing, including a computer-readable medium in which program instructions are stored, which instructions, when read by a computer, cause the computer to receive a set of formulas describing a target system, the formulas including clauses that include variables and express constraints on states of the system, the set of the formulas including at least a first and a second formula, and which instructions further cause the computer to analyze the first formula while deducing one or more conflict clauses, each such conflict clause expressing assignments of the variables that prevent a respective conflict, subject to which the first formula cannot be satisfied, while determining, for each of the conflict clauses, the clauses in the first formula that lead to the respective conflict, and to identify the conflict clauses for which the clauses that lead to the respective conflict in the first formula are a subset of the clauses in the second formula, and to analyze the second formula subject to the identified conflict clauses, in order to determine whether the second formula can be satisfied.

There is furthermore provided, in accordance with a preferred embodiment of the present invention, a computer software product for bounded model checking (BMC) of a target system, including a computer-readable medium in which program instructions are stored, which instructions, when read by a computer, cause the computer to receive a succession of BMC instances describing the target system in the form of propositional satisfiability (SAT) formulas, the formulas including clauses that include variables and express constraints on states of the system, and further cause the computer to analyze a first instance in the succession of the BMC instances while deriving one or more conflict clauses that forbid certain assignments of the variables that give rise to conflicts, subject to which the first instance cannot be satisfied, and to identify, for each of the instances in the succession subsequent to the first instance, the conflict clauses derived in a preceding one of the instances that are also pertinent to the subsequent instance, and which still further cause the computer to solve the subsequent instance subject to the identified conflict clauses, so as to seek a satisfying assignment of the variables, such that when a satisfying assignment is not found at the subsequent instance, the computer derives one or more further conflict clauses for use in solving a further one of the instances in the sequence.

The present invention will be more fully understood from the following detailed description of the preferred embodiments thereof, taken together with the drawings in which:

DETAILED DESCRIPTION OF PREFERRED EMBODIMENTS

Figure 1:
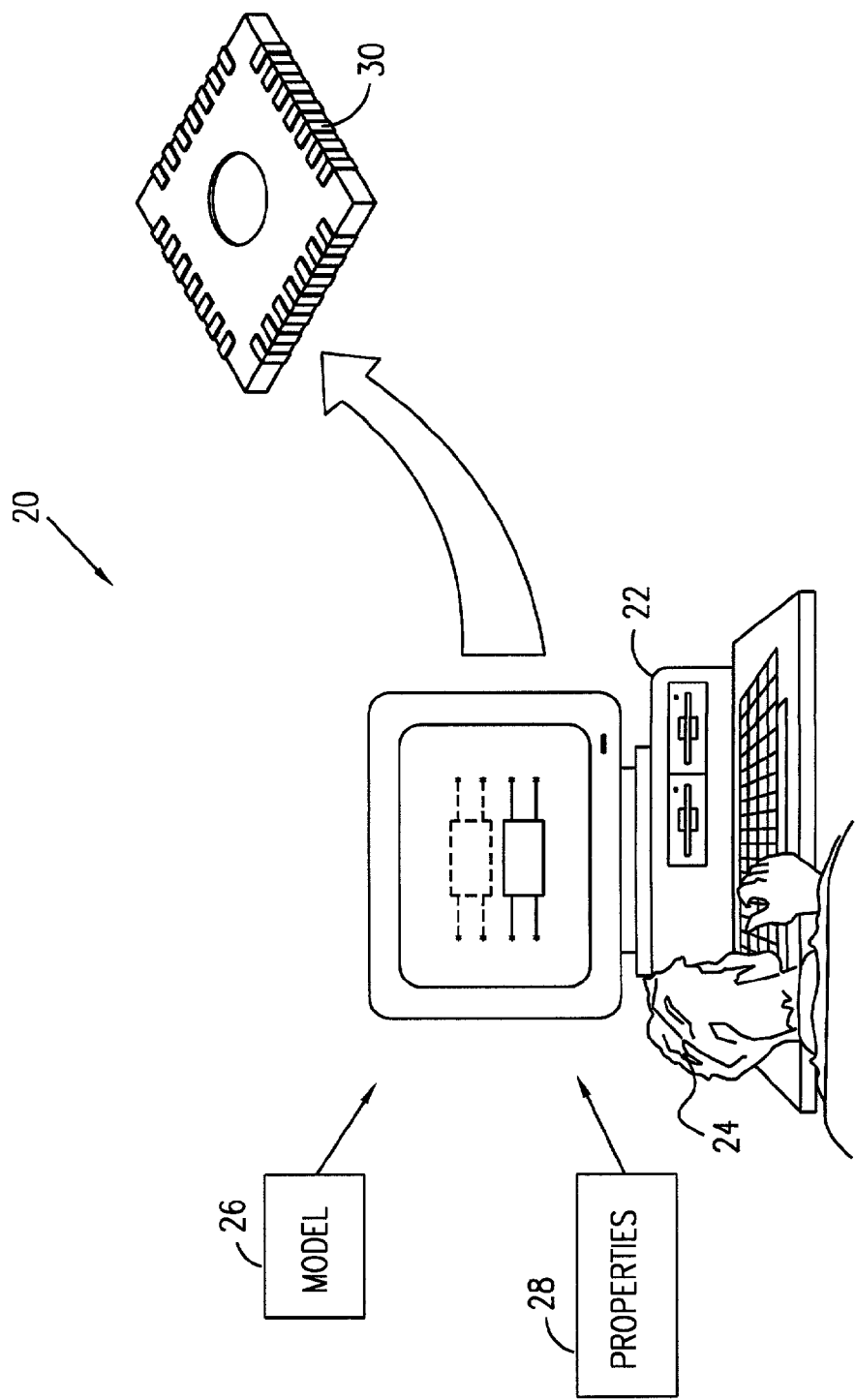
FIG. 1 is a schematic, pictorial illustration of a SAT-checking system, in accordance with a preferred embodiment of the present invention.

FIG. 1 is a schematic pictorial illustration of a system 20 for bounded model checking (BMC), in accordance with a preferred embodiment of the present invention. System 20 typically comprises a verification processor 22, typically a general-purpose computer workstation, running suitable SAT solving software, such as the above-mentioned GRASP tool, under the control of a verification engineer 24. The system receives an implementation model 26 of a target system or device 30 in development, typically written in a hardware description languages, such as Verilog or VHDL. Engineer 24 prepares properties 28, for use in model checking of the design of device 30. The compliance of the design with the specification is verified by processor 22 using BMC, while sharing constraints between SAT instances as described in detail hereinbelow.

Processor 22 preferably carries out its functions using software for this purpose running on processor 22. The software is preferably supplied as component of a model checking software package. Alternatively, the software for SAT solving and constraint sharing between SAT instances may be provided as an independent piece of software. In either case, the software may be conveyed to processor 22 in electronic form, over a network, for example, or on tangible media, such as CD-ROM.

Figure 2:
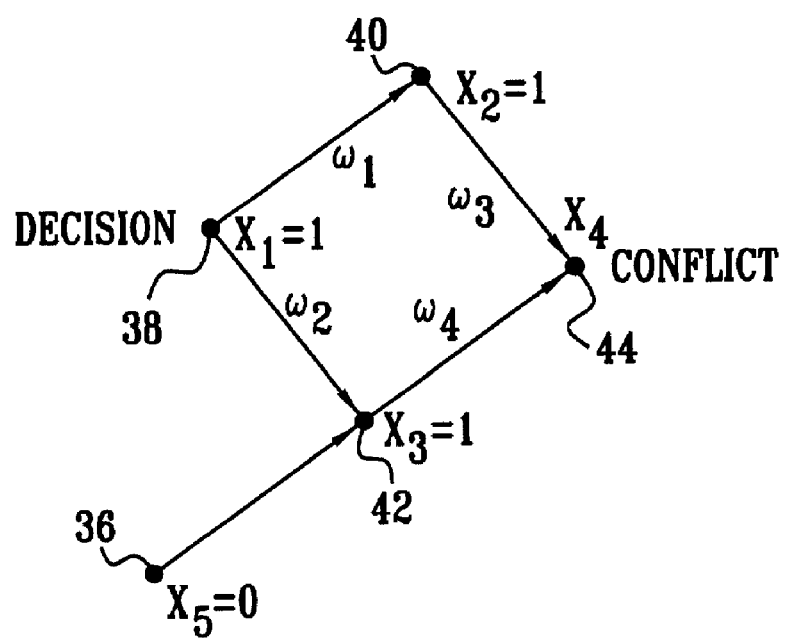
FIG. 2 is an implication graph illustrating identification of a conflict due to an unsatisfying assignment in a SAT problem.

FIG. 2 is an exemplary implication graph 34 that schematically illustrates how a conflict arises in a SAT instance. Graph 34 corresponds to a SAT formula $\phi$ on variables $\{x_1, \ldots, x_5\}$ which is represented in CNF as the conjunction of the following clauses:

$$\omega_1 = (\neg x_1 \vee x_2)$$
$$\omega_2 = (\neg x_1 \vee x_3 \vee x_5)$$
$$\omega_3 = (\neg x_2 \vee x_4)$$
$$\omega_4 = (\neg x_3 \vee \neg x_4) \quad (2)$$

Each of the nodes in graph 34 corresponds to an assignment of one of the variables. The edges in the graph are labeled with the clauses for which the variables connected by the edges are literals. The directions of the edge from $x_i$ to $x_j$ signifies the implication that the current value of $x_i$ implies the value of $x_j$ according to the unit clause rule. Vertices 36 and 38 in the graph, which have no incoming edges, correspond to decision assignments of the corresponding variables ($x_5$ and $x_1$ in the present example).

Applying the unit clause rule to the clauses listed above, it is seen that the assignment $x_1=1$ (i.e., Boolean True) at vertex 38 leads, on account of clause $\omega_1$, to the requirement at a succeeding vertex 40 that $x_2=1$, which in turn leads, via $\omega_3$, to the requirement that $x_4=1$ at a final vertex 44. On the other hand, the further assignment $x_5=0$ at vertex 36 leads via $\omega_2$ to the requirement that $X_3=1$ at a further vertex 42. This implication, in turn, leads via $\omega_4$ to the requirement that $x_4=0$ at vertex 44. Thus, processor 22 would conclude under these conditions that the assignment $\{x_1=1, x_5=0\}$ (exemplified by vertices 36 and 38 in the graph) must invariably lead to a conflict, whereby either $\omega_3$ or $\omega_4$ cannot be satisfied. The negation of this joint assignment must be satisfied in order for this SAT instance to be satisfiable. Therefore, a conflict clause $\pi=(\neg x_1 \vee x_5)$ can be added to $\phi$ to be used subsequently in order to speed up the search for a satisfying assignment to the variables.

Now let $S_1$ and $S_2$ be sets of clauses that are respectively associated with two CNF SAT instances, and define $\phi_0$ as the formula or set of clauses common to the two instances, i.e., $\phi_0 = S_1 \cap S_2$. Let $\psi$ be the set of clauses that are deducible from $\phi_0$, and define $\phi_0 = S_1 \backslash \phi_0$ and $\phi_2 = S_2 \backslash \phi_0$. It follows logically that $S_2$ is satisfiable if $S_2 \wedge \psi$ is satisfiable. In our case, $\psi$ can be taken to represent the conflict clauses derived from $\phi_0$ in the SAT instance associated with $S_1$, and the conclusion is that these clauses, once identified, can be added to the CNF representation of $S_2$ for use in constraining the search for an assignment that satisfies $S_2$.

It is not always true that two different SAT instances will have a large intersection $\phi_0$, so that the number of shared conflict clauses $\psi$ may not be great. For the case of BMC, however, referring back to equation (1), it can be seen that the clauses of $\phi^k$ are a subset of the clauses of $\phi^t (t>k)$, except for the disjunction containing the negated property $$\bigvee_{i=0}^{k} \neg P_i.$$

Thus, $\phi_1$ comprises this single clause.

Figure 3:
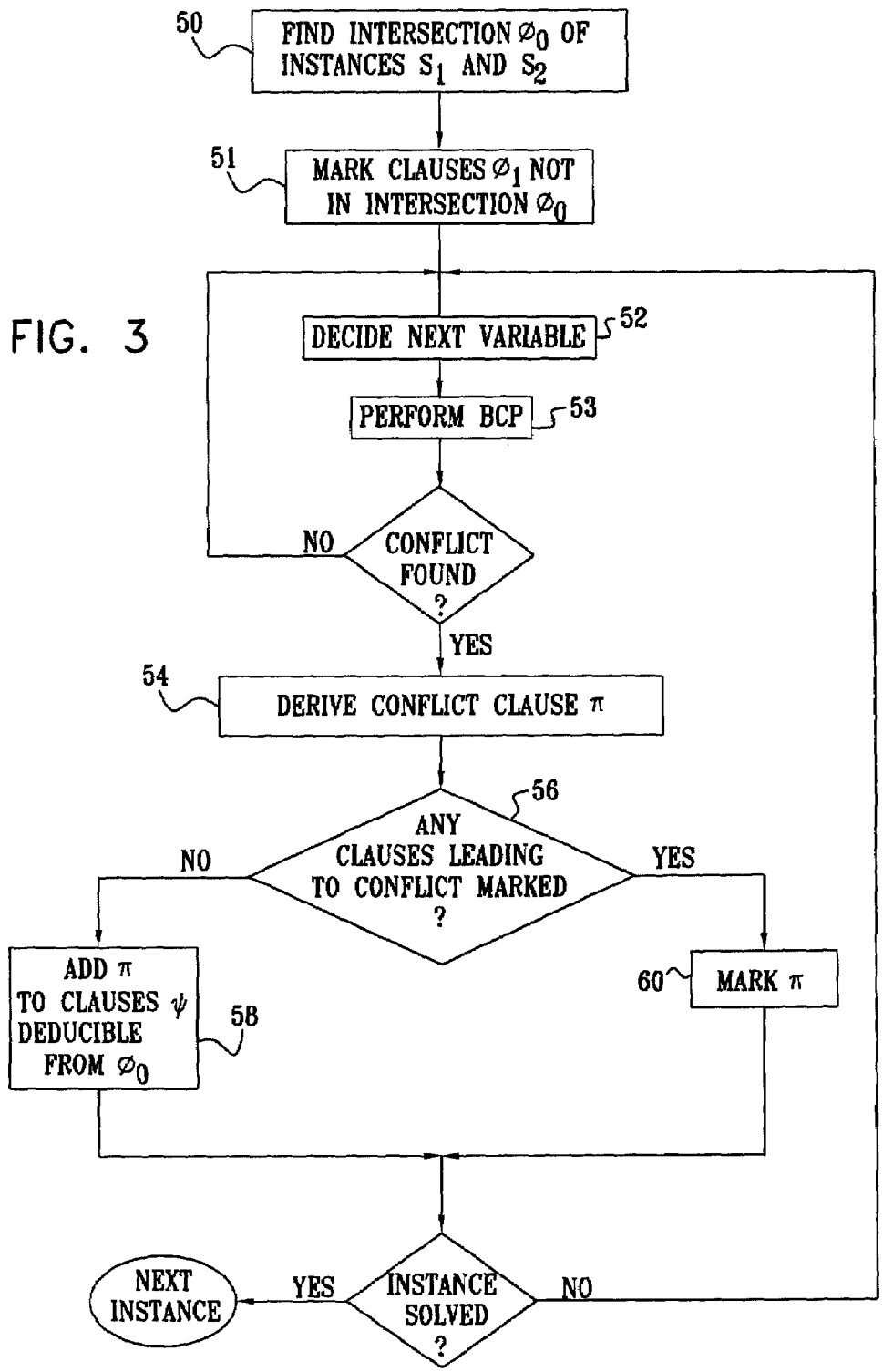
FIG. 3 is a flow chart that schematically illustrates a method for identifying conflict clauses that can be shared between SAT instances, in accordance with a preferred embodiment of the present invention.

FIG. 3 is a flow chart that schematically illustrates a method for finding conflict clauses $\psi$ that are shared between SAT instances described by the sets of clauses $S_1$ and $S_2$, in accordance with a preferred embodiment of the present invention. This method enables the shared conflict clauses to be found while solving the first instance $S_1$. Preferably before beginning to solve $S_1$, at an intersection step 50, processor 22 identifies the clauses in the intersection $\phi_0$ of $S_1$ and $S_2$. All clauses in $\phi_1$ (the disjoint portion of $S_1$) are marked, at a marking step 51. (Equivalently, the clauses $\phi_0$ could be marked instead and the method below altered accordingly.) SAT solving of $S_1$ proceeds iteratively, using tools known in the art, such as GRASP. At each iteration, another variable is chosen and assigned, at a variable decision step 52. BCP is applied, using the new assignment, at a BCP step 53. As long as the assignment does not cause any conflicts to arise, steps 52 and 53 are repeated for the next variable. When conflicts occur, new conflict clauses $\pi$ for $S_1$ are derived accordingly, at a conflict clause derivation step 54.

Processor 22 examines the clauses $\omega_j$ leading up to the newly-discovered conflict that gave rise to conflict clause $\pi$, at an implication checking step 56. If none of these clauses are marked, it means that $\pi$ was derived from clauses that belong to the intersection $\phi_0$, and is accordingly added to $\psi$, at a clause addition step 58. On the other hand, if any of the clauses leading up to the conflict are marked, it means that $\pi$ cannot be included in $\psi$. $\pi$ is accordingly marked as belonging to $\phi_1$, at a conflict marking step 60. This procedure continues until instance $S_1$ has been solved. When $S_1$ is solved, $\psi$ is merged with $S_2$ and used in solving that instance.

Figure 4:
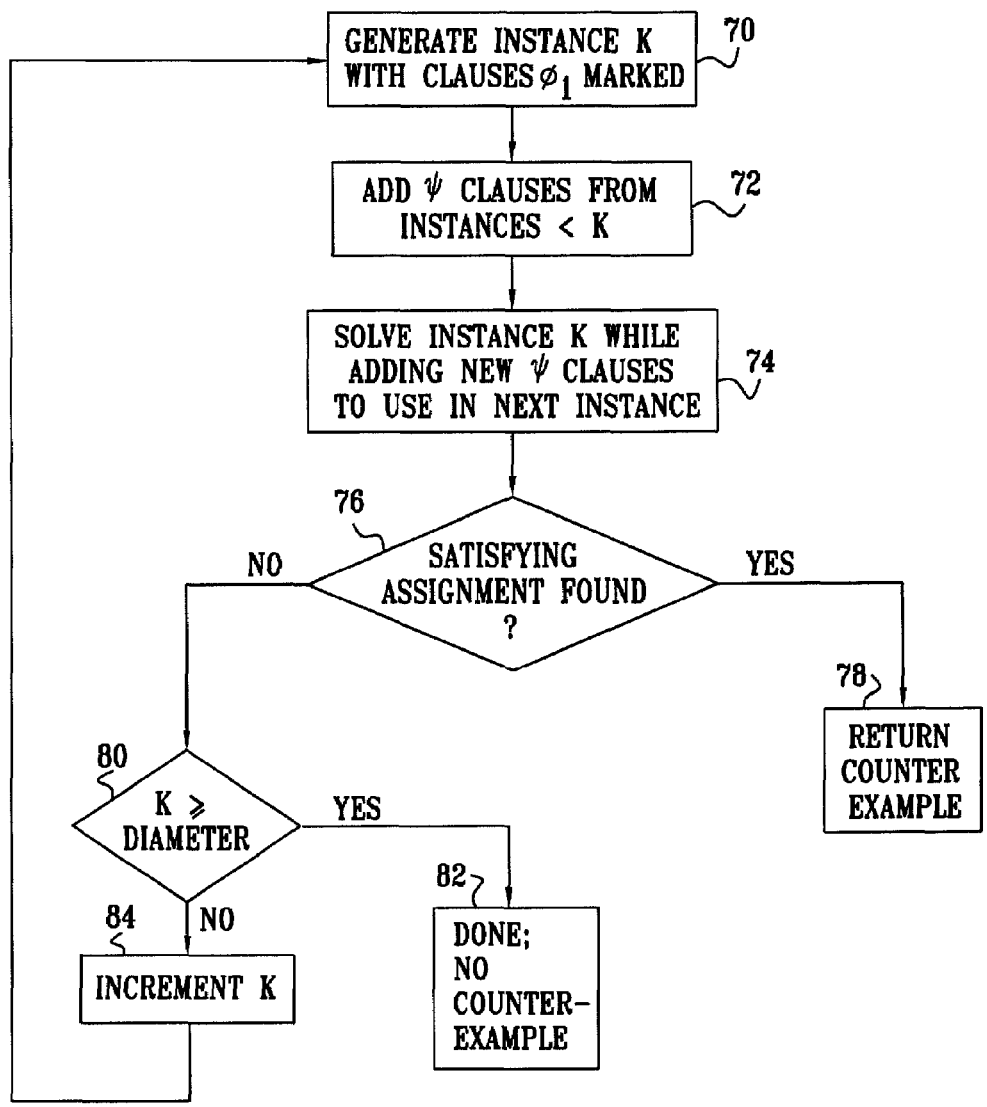
FIG. 4 is a flow chart that schematically illustrates a method for solving a sequence of SAT instances using shared conflict clauses, in accordance with a preferred embodiment of the present invention.

FIG. 4 is a flow chart that schematically illustrates a procedure by which the method of FIG. 3 can be used in solving an iterative sequence of BMC instances, in accordance with a preferred embodiment of the present invention. In this case, because of the nature of BMC, as described above and exemplified by equation (1), all of the $\psi$ clauses passed to a given instance by the instance before it are also passed on to the next instance in the sequence (along with additional $\psi$ clauses found in solving the given instance itself).

For any given BMC instance k in the sequence, processor 22 begins the procedure of FIG. 4 by generating the corresponding set of clauses $S_k$, at an instance generation step 70. The set of clauses $\phi_0$ that are common to $S_k$ and to the clauses of the next instance $S_{k+\delta}$ is found, and the clauses in $S_k$ that are in $\phi_1$ are marked, as at step 52, described above. (Here $\delta$ denotes the increment applied to k from one instance to the next.) $S_k$ is supplemented by conjunction with the conflict clauses in $\psi$ from the previous instance or instances, at a conjunction step 72 (except, of course, when $S_k$ is the first instance in the sequence). Processor 22 then attempts to solve $S_k$, at a SAT solution step 74. Any new conflict clauses that are deducible from $\phi_0$ are added to $\psi$ for use in solving instance $S_{k+\delta}$.

If in the course of step 74, processor 22 finds an assignment of all of the variables in instance k that satisfies $S_k$, it means that the SAT problem has been solved, at a solution step 76. In this case, the process returns a counterexample corresponding to the solution, at a return step 78, and the BMC analysis is complete. Alternatively, if no satisfying assignment is found, the processor checks to determine whether further instances should be checked, at a diameter checking step 80. Typically, the current value of k is checked against a predetermined diameter of the design, and if k has reached this diameter, the procedure is terminated. Alternatively, another criterion may be applied, such as an arbitrary termination value or a time limit. If the diameter or other limit has been reached, the processor reports that no counterexample has been found, at a non-solution step 82. Otherwise, k is incremented to k+$\delta$, at an incrementation step 84, and the procedure loops back to step 70.

Although preferred embodiments are described hereinabove with reference to certain methods and languages used in BMC and SAT solving, it will be understood that the application of the present invention is not limited to any particular language or method of implementation. Similarly, although specific reference is made herein to verification of the design of electronic devices, those skilled in the art will appreciate that the principles of the present invention may similarly be used in other areas of verification, not only for electronic devices, as well as for evaluation of other types of target systems, as well. Moreover, although the preferred embodiments described herein relate specifically to BMC, the methods of the present invention are also applicable to SAT problems in other areas, such as electronic design automation and planning and logistics problems. Thus, the term "target system" as used in the context of the present patent application and in the claims should be understood to refer to substantially any type of system having variables and constraints that are amenable to SAT solving.

It will thus be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A computer-implemented method for satisfiability (SAT) testing, given a set of formulas describing a target system, the formulas including clauses, which include variables and which express constraints on states of the system, the set of the formulas including at least a first and a second formula, the method comprising:
   analyzing the first formula so as to deduce one or more conflict clauses, each such conflict clause expressing assignments of the variables that prevent a respective conflict, subject to which the first formula cannot be satisfied, while determining, for each of the conflict clauses, the clauses in the first formula that lead to the respective conflict;
   identifying the conflict clauses for which the clauses that lead to the respective conflict in the first formula are a subset of the clauses in the second formula; and
   analyzing the second formula subject to the identified conflict clauses, in order to determine whether the second formula can be satisfied.

2. A method according to claim 1, wherein the clauses are formulated in a conjunctive normal form (CNF), and wherein analyzing the second formula comprises forming a conjunction of the CNF of the second formula with the identified conflict clauses, and solving the conjunction.

3. A method according to claim 1, wherein analyzing the first formula comprises determining while analyzing the first formula whether, for each of the conflict clauses, the clauses that lead to the respective conflict are in the subset of the clauses in the second formula.

4. A method according to claim 1, wherein the set of formulas comprises a sequence of bounded model checking (BMC) instances, and wherein analyzing the first and second formulas comprises solving the BMC instances.

5. A computer-implemented method for bounded model checking (BMC) of a target system, comprising:
   generating a succession of BMC instances describing the target system in the form of propositional satisfiability (SAT) formulas, the formulas comprising clauses, which comprise variables and which express constraints on states of the system;
   analyzing a first instance in the succession of the BMC instances while deriving one or more conflict clauses that forbid certain assignments of the variables that give rise to conflicts, subject to which the first instance cannot be satisfied;
   for each of the instances in the succession subsequent to the first instance, identifying the conflict clauses derived in a preceding one of the instances that are also pertinent to the subsequent instance; and
   solving the subsequent instance subject to the identified conflict clauses, so as to seek a satisfying assignment of the variables, such that when a satisfying assignment is not found at the subsequent instance, one or more further conflict clauses are derived for use in solving a further one of the instances in the sequence.

6. A method according to claim 5, wherein identifying the conflict clauses comprises finding the conflict clauses that are induced by the clauses in the preceding one of the instances that are also comprised in the subsequent instance.

7. A method according to claim 5, wherein solving the subsequent instance comprises solving the subsequent instance subject to substantially all of the conflict clauses identified as pertinent to the subsequent instance in a plurality of the instances in the sequence prior to the subsequent instance.

8. A method according to claim 5, wherein generating the succession of BMC instances comprises defining a model and a safety property of the target system, and wherein solving each of the instances comprises finding a violation of the safety property corresponding to the satisfying assignment.

9. A method according to claim 5, wherein generating the succession of BMC instances comprises formulating the logical clauses in a conjunctive normal form (CNF), and wherein solving the subsequent instance comprises forming a conjunction of the CNF of the subsequent instance with the identified conflict clauses, and solving the conjunction.

10. Apparatus for satisfiability (SAT) testing, comprising a satisfiability processor, which is arranged to receive a set of formulas describing a target system, the formulas comprising clauses, which comprise variables and which express constraints on states of the system, the set of the formulas comprising at least a first and a second formula, the processor being further arranged to analyze the first formula while deducing one or more conflict clauses, each such conflict clause prevent assignments of the variables that give rise to a respective conflict, subject to which the first formula cannot be satisfied, while determining, for each of the conflict clauses, the clauses in the first formula that lead to the respective conflict, and to identify the conflict clauses for which the clauses that lead to the respective conflict in the first formula are a subset of the clauses in the second formula, the processor being still further arranged to analyze the second formula subject to the identified conflict clauses, in order to determine whether the second formula can be satisfied.

11. Apparatus according to claim 10, wherein the set of formulas are provided in a conjunctive normal form (CNF), and wherein the processor is arranged to analyze the second formula by forming a conjunction of the CNF of the second formula with the identified conflict clauses, and solving the conjunction.

12. Apparatus according to claim 10, wherein the processor is arranged to determine while analyzing the first formula whether, for each of the conflict clauses, the clauses that lead to the respective conflict are in the subset of the clauses in the second formula.

13. Apparatus according to claim 10, wherein the set of formulas comprises a sequence of bounded model checking (BMC) instances.

14. Apparatus for bounded model checking (BMC) of a target system, comprising a verification processor, which is arranged to receive a succession of BMC instances describing the target system in the form of propositional satisfiability (SAT) formulas, the formulas comprising clauses, which comprise variables and which express constraints on states of the system, the processor being further arranged to analyze a first instance in the succession of the BMC instances while deriving one or more conflict clauses that forbid certain assignments of the variables that give rise to conflicts, subject to which the first instance cannot be satisfied, and to identify, for each of the instances in the succession subsequent to the first instance, the conflict clauses derived in a preceding one of the instances that are also pertinent to the subsequent instance, the processor being still further arranged to solve the subsequent instance subject to the identified conflict clauses, so as to seek a satisfying assignment of the variables, such that when a satisfying assignment is not found at the subsequent instance, the processor derives one or more further conflict clauses for use in solving a further one of the instances in the sequence.

15. Apparatus according to claim 14, wherein the processor is arranged to identify the conflict clauses that are also pertinent to the subsequent instance by finding the conflict clauses that are induced by the clauses in the preceding one of the instances that are also comprised in the subsequent instance.

16. Apparatus according to claim 14, wherein the processor is arranged to solve the subsequent instance subject to substantially all of the conflict clauses identified as pertinent to the subsequent instance in a plurality of the instances in the sequence prior to the subsequent instance.

17. Apparatus according to claim 14, wherein the succession of BMC instances are defined by a model and a safety property of the target system, and wherein the processor is arranged, by solving each of the instances, to find a violation of the safety property corresponding to the satisfying assignment.

18. Apparatus according to claim 14, wherein the succession of BMC instances are formulated in a conjunctive normal form (CNF), and wherein the processor is arranged to solve the subsequent instance by forming a conjunction of the CNF of the subsequent instance with the identified conflict clauses, and solving the conjunction.

19. A computer software product for satisfiability (SAT) testing, comprising a computer-readable medium in which program instructions are stored, which instructions, when read by a computer, cause the computer to receive a set of formulas describing a target system, the formulas comprising clauses, which comprise variables and which express constraints on states of the system, the set of the formulas comprising at least a first and a second formula, and which instructions further cause the computer to analyze the first formula while deducing one or more conflict clauses, each such conflict clause expressing assignments of the variables that prevent a respective conflict, subject to which the first formula cannot be satisfied, while determining, for each of the conflict clauses, the clauses in the first formula that lead to the respective conflict, and to identify the conflict clauses for which the clauses that lead to the respective conflict in the first formula are a subset of the clauses in the second formula, and to analyze the second formula subject to the identified conflict clauses, in order to determine whether the second formula can be satisfied.

20. A product according to claim 19, wherein the set of formulas are provided in a conjunctive normal form (CNF), and wherein the instructions cause the computer to analyze the second formula by forming a conjunction of the CNF of the second formula with the identified conflict clauses, and solving the conjunction.

21. A product according to claim 19, wherein the instructions cause the computer to determine while analyzing the first formula whether, for each of the conflict clauses, the clauses that lead to the respective conflict are in the subset of the clauses in the second formula.

22. A product according to claim 19, wherein the set of formulas comprises a sequence of bounded model checking (BMC) instances.

23. A computer software product for bounded model checking (BMC) of a target system, comprising a computer-readable medium in which program instructions are stored, which instructions, when read by a computer, cause the computer to receive a succession of BMC instances describing the target system in the form of propositional satisfiability (SAT) formulas, the formulas comprising clauses, which comprise variables and which express constraints on states of the system, and further cause the computer to analyze a first instance in the succession of the BMC instances while deriving one or more conflict clauses that forbid certain assignments of the variables that give rise to conflicts, subject to which the first instance cannot be satisfied, and to identify, for each of the instances in the succession subsequent to the first instance, the conflict clauses derived in a preceding one of the instances that are also pertinent to the subsequent instance, and which still further cause the computer to solve the subsequent instance subject to the identified conflict clauses, so as to seek a satisfying assignment of the variables, such that when a satisfying assignment is not found at the subsequent instance, the computer derives one or more further conflict clauses for use in solving a further one of the instances in the sequence.

24. A product according to claim 23, wherein the instructions cause the computer to identify the conflict clauses that are also pertinent to the subsequent instance by finding the conflict clauses that are induced by the clauses in the preceding one of the instances that are also comprised in the subsequent instance.

25. A product according to claim 23, wherein the instructions cause the computer to solve the subsequent instance subject to substantially all of the conflict clauses identified as pertinent to the subsequent instance in a plurality of the instances in the sequence prior to the subsequent instance.

26. A product according to claim 23, wherein the succession of BMC instances are defined by a model and a safety property of the target system, and wherein the instructions cause the computer, by solving each of the instances, to find a violation of the safety property corresponding to the satisfying assignment.

27. A product according to claim 23, wherein the succession of BMC instances are formulated in a conjunctive normal form (CNF), and wherein the instructions cause the computer to solve the subsequent instance by forming a conjunction of the CNF of the subsequent instance with the identified conflict clauses, and solving the conjunction.

* * * * *